US012763763B2

(12) United States Patent
Hsu et al.

(10) Patent No.: US 12,763,763 B2
(45) Date of Patent: Oct. 13, 2026

(54) DRIVING CIRCUIT FOR POWER SWITCH DEVICE AND METHOD THEREOF

(71) Applicant: Fast SiC Semiconductor Incorporated, Hsinchu (TW)

(72) Inventors: Fu-Jen Hsu, Hsinchu (TW); Cheng-Tyng Yen, Hsinchu (TW); Hsiang-Ting Hung, Hsinchu (TW)

(73) Assignee: Fast SiC Semiconductor Incorporated, Hsinchu City (TW)

( * ) Notice: Subject to any disclaimer, the term of this patent is extended or adjusted under 35 U.S.C. 154(b) by 1 day.

(21) Appl. No.: 19/016,392

(22) Filed: Jan. 10, 2025

(65) Prior Publication Data

US 2026/0205103 A1 Jul. 16, 2026

(51) Int. Cl.
*H03K 17/04* (2006.01)

(52) U.S. Cl.
CPC .................................... *H03K 17/04* (2013.01)

(58) Field of Classification Search
CPC ...................................................... H03K 17/04
See application file for complete search history.

(56) References Cited

U.S. PATENT DOCUMENTS

| | | | | |
|---|---|---|---|---|
| 5,486,484 | A | 1/1996 | Malhi | |
| 7,808,301 | B2 | 10/2010 | Chen et al. | |
| 9,018,640 | B1 | 4/2015 | Hung et al. | |
| 9,059,697 | B2 | 6/2015 | Shiina | |
| 9,373,713 | B2 | 6/2016 | Yen et al. | |
| 10,020,368 | B2 | 7/2018 | Yen et al. | |
| 10,483,398 | B2 | 11/2019 | Chang et al. | |
| 11,108,388 | B1 * | 8/2021 | Hsu | H03K 17/162 |
| 11,184,003 | B2 | 11/2021 | Hsu et al. | |
| 2010/0156513 | A1 | 6/2010 | Saldivar et al. | |
| 2016/0211830 | A1 * | 7/2016 | Itakura | G01T 1/208 |
| 2021/0202673 | A1 * | 7/2021 | Kim | H10K 59/1216 |
| 2025/0110521 | A1 * | 4/2025 | Maruyama | G05F 3/205 |

FOREIGN PATENT DOCUMENTS

| | | |
|---|---|---|
| CN | 104104369 | 10/2014 |
| CN | 108809060 | 11/2018 |

OTHER PUBLICATIONS

B. Zhang, S. Xie, J. Xu, Q. Qian, Z. Zhang and K. Xu, "A Magnetic Coupling Based Gate Driver for Crosstalk Suppression of SiC MOSFETs," in IEEE Transactions on Industrial Electronics, vol. 64, No. 11, pp. 9052-9063, Nov. 2017.

* cited by examiner

*Primary Examiner* — Sibin Chen
(74) *Attorney, Agent, or Firm* — Muncy, Geissler, Olds & Lowe, P.C.

(57) ABSTRACT

A switching device controlled by a driver is described. The driver provides a gate-source voltage and a source voltage to a power semiconductor device of the switching device. The source voltage increases with an increment of the gate-source voltage, or the source voltage decreases with a decrement of the gate-source voltage, such that the gate-source voltage exceeds a positive or negative predetermined threshold as early as possible, thereby enhancing switch speed of the power semiconductor device.

9 Claims, 3 Drawing Sheets

DRIVING CIRCUIT FOR POWER SWITCH DEVICE AND METHOD THEREOF

FIELD OF THE INVENTION

The invention relates to a driving circuit and device employing on switches and to electrical devices which include one or more such circuits.

BACKGROUND OF THE INVENTION

Key switch topologies, such as half-bridge and full-bridge, can be implemented using silicon (Si), silicon carbide (SiC), or gallium nitride (GaN) devices. Silicon IGBT (Insulated Gate Bipolar Transistor) technology, paired with Si anti-parallel diodes, is widely established in power applications for its reliable performance and affordability. However, newer wide bandgap (WBG) semiconductor technologies, such as SiC and GaN, offer distinct performance advantages, including greater efficiency, faster switching frequencies, and lower power losses—though these benefits come at a significantly higher cost.

SiC technology, in particular, is well-suited for high-power and high-temperature applications. This is due to SiC's physical advantages over conventional silicon, including a wide energy bandgap, high breakdown field strength, high electron drift velocity, and superior thermal conductivity. These properties allow SiC power switches to perform efficiently under extreme conditions, achieving much lower specific on-resistance than silicon-based devices. As a result, SiC unipolar devices are anticipated to replace silicon-based bipolar switches, such as IGBTs, and rectifiers in specific voltage ranges where these properties provide clear advantages.

However, the unique characteristics of SiC also brings design challenges, particularly in high-speed switching applications. During rapid switching transients in bridge circuits, the high dv/dt and di/dt inherent to SiC can lead to significant crosstalk effects on complementary devices. This crosstalk is influenced by parasitic elements within the device and its packaging, and SiC's lower turn-on threshold voltage and reduced reverse voltage withstand capability can make it vulnerable to voltage fluctuations from crosstalk. Reducing the impact of these effects is essential to ensuring the safe and reliable operation of SiC devices, especially in high-frequency applications.

Related solutions can be found in U.S. Pat. Nos. 11,108,388 and 11,184,003. Nevertheless, switching speed may be compromised, as the voltage level must be reversed when spikes occur.

SUMMARY OF THE INVENTION

This disclosure describes techniques for improving the switching speed of a power semiconductor device while maintaining safe operation during the transient turn-on and turn-off. By overdriving the gate of the power semiconductor device, the durations of these transient phases can be shortened, and the gate-source voltage can be kept within a safe range with the help of the driver control circuit's function.

In some examples, a method for controlling a switching device is described. The method comprises the following steps: providing a power semiconductor device which is controlled by a driver, wherein a gate-source voltage and a source voltage are provided to the power semiconductor device; outputting a gate-driving signal by the driver to a gate of the power semiconductor device, wherein when the gate-source voltage increases in response to the gate-driving signal, the source voltage increases such that the gate-source voltage exceeds a positive predetermined threshold, and when the gate-source voltage decreases in response to the gate-driving signal, the source voltage decreases such that the gate-source voltage exceeds a negative predetermined threshold; and when the gate-source voltage exceeds either the positive or negative predetermined threshold, the driver controls the gate-source voltage to be within a safety range.

In some examples, a switching device controlled by a driver is described. The driver provides a gate-source voltage and a source voltage to a power semiconductor device of the switching device. The source voltage increases with an increment of the gate-source voltage, or the source voltage decreases with a decrement of the gate-source voltage, such that the gate-source voltage exceeds a positive or negative predetermined threshold.

In some examples, a switching device controlled by a driver is described. The driver provides a gate-source voltage and a source voltage to a power semiconductor device of the switching device. When a slew direction of the gate-source voltage is changed from positive to negative, the source voltage is decreased, wherein when a slew direction of the gate-source voltage is changed from negative to positive, the source voltage is increased.

BRIEF DESCRIPTION OF THE DRAWINGS

Example embodiments of the present disclosure will be described with reference to the accompanying drawings briefly described below.

DETAILED DESCRIPTION

Prior to turning to the figures, which illustrate exemplary embodiments in detail, it should be understood that this disclosure is not limited to the specific details or methodologies described or shown in the figures. Additionally, the terminology used herein is for descriptive purposes only and should not be considered limiting.

Throughout the specification and claims, the meanings provided below are not intended to strictly limit the terms but to serve as illustrative examples. The terms "a," "an," and "the" should be understood to include plural references, and "in" should be interpreted as including "in" and "on." The phrase "in an embodiment" or "in an example," as used herein, does not necessarily refer to the same embodiment or example, although it may.

A method and circuit for use on power semiconductor devices that controlled so as to modulate the flow of electrical current from one or more electrical sources to one or more electrical loads is described. The power semiconductor device may be a switch that is made from a semiconductor material such as silicon (Si), silicon carbide (SiC), Gallium Nitride (GaN) and other Wide Bandgap materials (WBGs). The switch may be an insulated gate bipolar transistor (IGBT), a metal-oxide-semiconductor field-effect transistor (MOSFET), a junction gate field-effect transistor (JFET) or other power semiconductor devices. In these embodiments, a MOS transistor serves as an example of a MISFET (Metal Insulator Semiconductor Field Effect Transistor). However, the use of a non-oxide film as the gate insulating film is also applicable.

Figure 1:
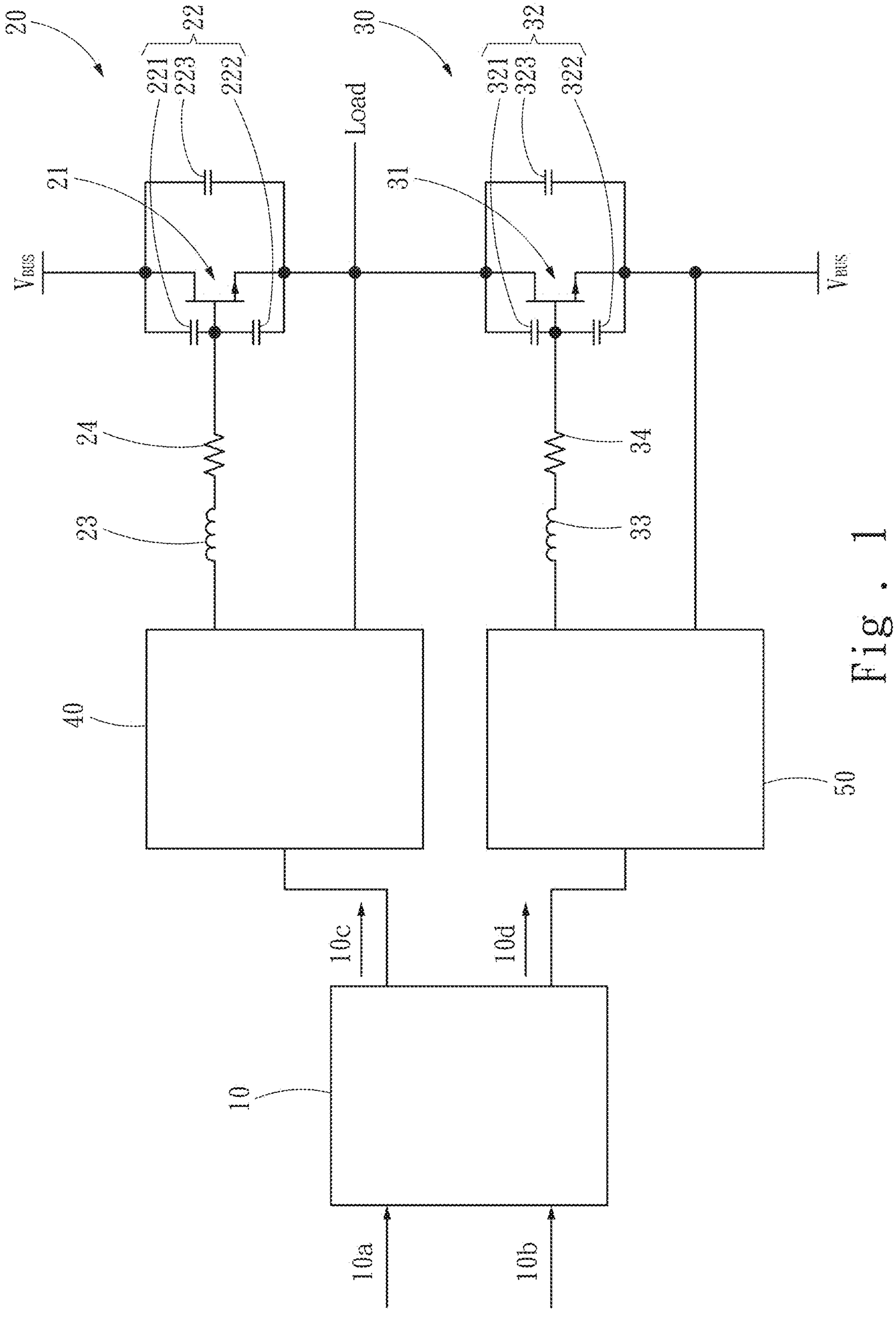
FIG. 1 illustrates an exemplary circuit topology that is implemented in various embodiments of the present disclosure.

FIG. 1 is a circuit block diagram illustrating an example of a half-bridge switching circuit and its associated driving circuitry, commonly used in power electronic applications like power conversion devices. The switches shown in FIG. 1 are normally-on SiC MOSFETs. The half-bridge circuit can serve multiple functions, such as being part of a power supply for a DC/DC conversion circuit, part of a DC/AC conversion circuit (expandable into a full-bridge circuit, a three-phase inverter, etc.), or as part of a motor control device.

The half-bridge circuit in FIG. 1 comprises a gate driver control circuit 10, an upper-arm side switch element 20, a lower-arm side switch element 30, a first gate driver circuit 40, and a second gate driver circuit 50. Each of the side switch elements, 20 and 30, includes a SiC MOSFET, referred to here as a high-side power transistor 21 and a low-side power transistor 31, respectively. The power transistors 21 and 31 may be connected with one or more analog electronic components. In this example, the high-side power transistor 21 is connected in parallel with three first capacitors 22, and the low-side power transistor 31 is connected in parallel with three second capacitors 32. The first capacitors include a gate-drain capacitor 221, a gate-source capacitor 222, and a drain-source capacitor 223. The second capacitors include a gate-drain capacitor 321, a gate-source capacitor 322, and a drain-source capacitor 323. In other examples, the electronic components may be diodes (such as a free-wheeling diode or a Zener diode), resistors, inductors, or combinations thereof, depending on the circuit's application. As exemplified in FIG. 1, the upper-arm side switch element 20 may also connect to a first inductor 23 and a first resistor 24, while the lower-arm side switch element 30 may connect to a second inductor 33 and a second resistor 34.

A power supply voltage $V_{BUS}$ is supplied to a drain of the power transistor 21 and a source of the power transistor 31, and a source of the power transistor 21 is connected to a drain of the power transistor 31. The gate driver control circuit 10 receives an upper-arm control signal 10*a* and a lower-arm control signal 10*b*, and outputs an upper-arm driver control signal 10*c* and a lower-arm driver control signal 10*d*. The driver control signals 10*c*, 10*d* are generated by using, for example, a microcontroller or similar IC chip. The gate driver control circuit 10 plays roles of, for example, a voltage level converting function, a timing adjusting function, a noise cancelling function, and a protecting function for the driver control signals 10*c*, 10*d*.

Operation of the power transistors 21, 31 may be controlled via voltages respectively applied to the source, the gate, and the drain, terminals of the power transistors 21, 31. In particular, a current from the source to the drain, of the power transistors 21, 31 may be controlled via a gate-source voltage $V_{gs}$ in view of the I-V characteristics of such device. The NMOS FETs operate on positive voltages and PMOS FETs operate on negative voltages. In the present disclosure, the NMOS FETs is provided for the purpose for illustration, which typically has a positive threshold voltage $V_{th}$ and a positive drain-to-source voltage.

Figure 2:
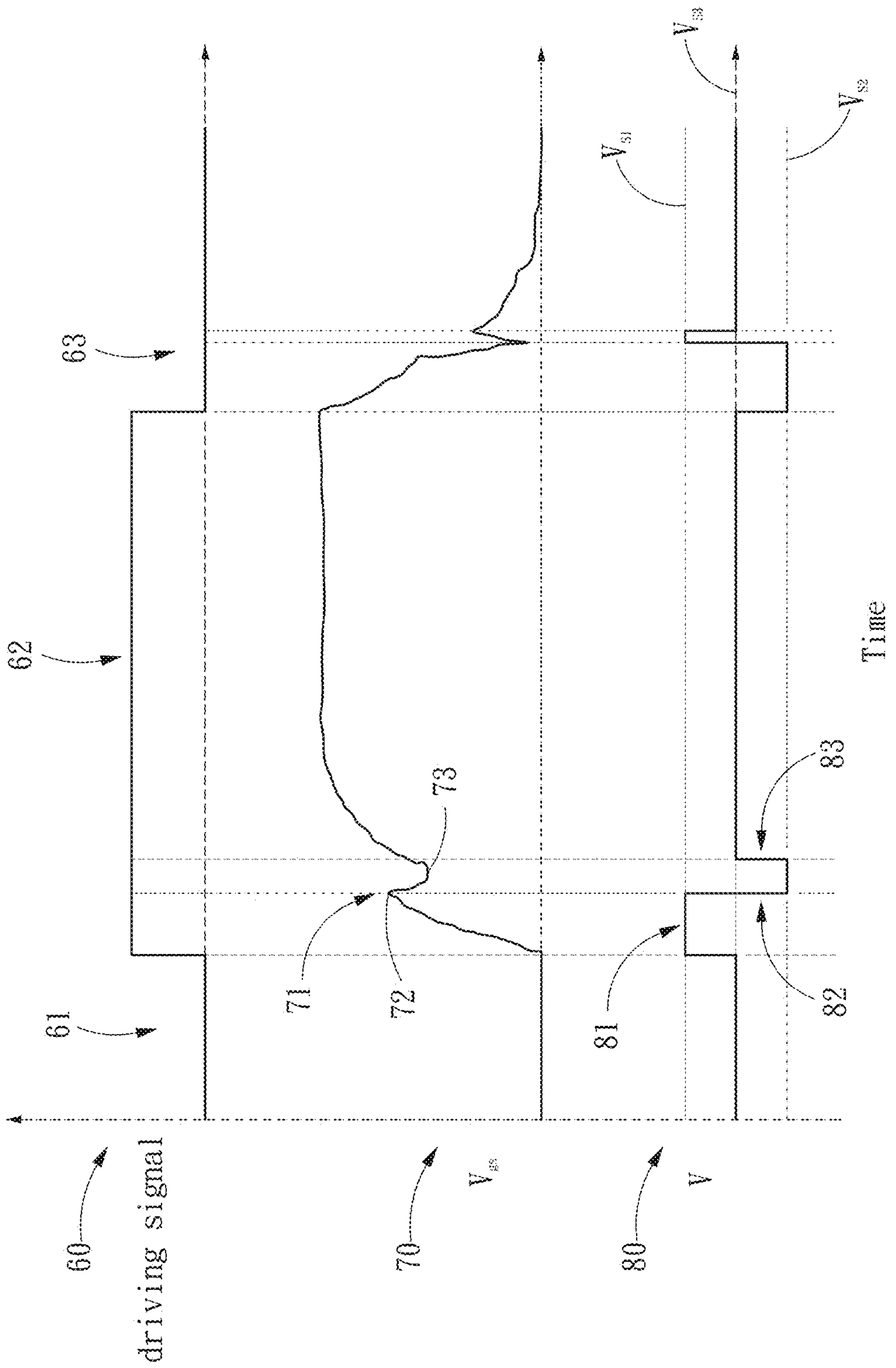
FIG. 2 is a timing diagram illustrating variation of signal and voltages during switch of high-side switch, in an embodiment of the present disclosure.

FIG. 2 is a timing chart illustrating an example of the operation of each part in the gate driver. FIG. 2 illustrates a diagram 60 of the on cycle in which the high side switch (the power transistors 21) is first off, period 61, is switched on, period 62, and is then switched off again, period 63. FIG. 2 also illustrates an operation waveform 70 indicating the gate-source voltage $V_{gs}$ at the high side switch 21. During the initiation period, the gate-drain capacitor 221 of the upper-arm side switch element 20 is charged, causing a current to flow through the gate loop resulting in a positive overvoltage on the gate-source voltage $V_{gs}$. Once the voltage exceeds a turn-on voltage, the high side switch 21 changes state. The rapid switching characteristics of wide-bandgap semiconductors can lead to challenges such as crosstalk, primarily due to overvoltage and ringing during fast switching transitions. As illustrated in FIG. 2, crosstalk occurs during the transition period 71, which is characterized by both positive and negative gate voltage spikes. The positive spikes can trigger unintended turn-on events, while the negative spikes can impose excessive stress on the gate, particularly since the minimum allowable gate voltages for mainstream WBG power devices are constrained. Current state-of-the-art gate driver is capable of detecting and dynamically controlling the gate-source voltage $V_{gs}$ when it exceeds a threshold. In details, the current state-of-the-art gate driver gate driver would suppress the gate voltage spikes when the threshold is reached, thereby protecting the device.

Figure 3:
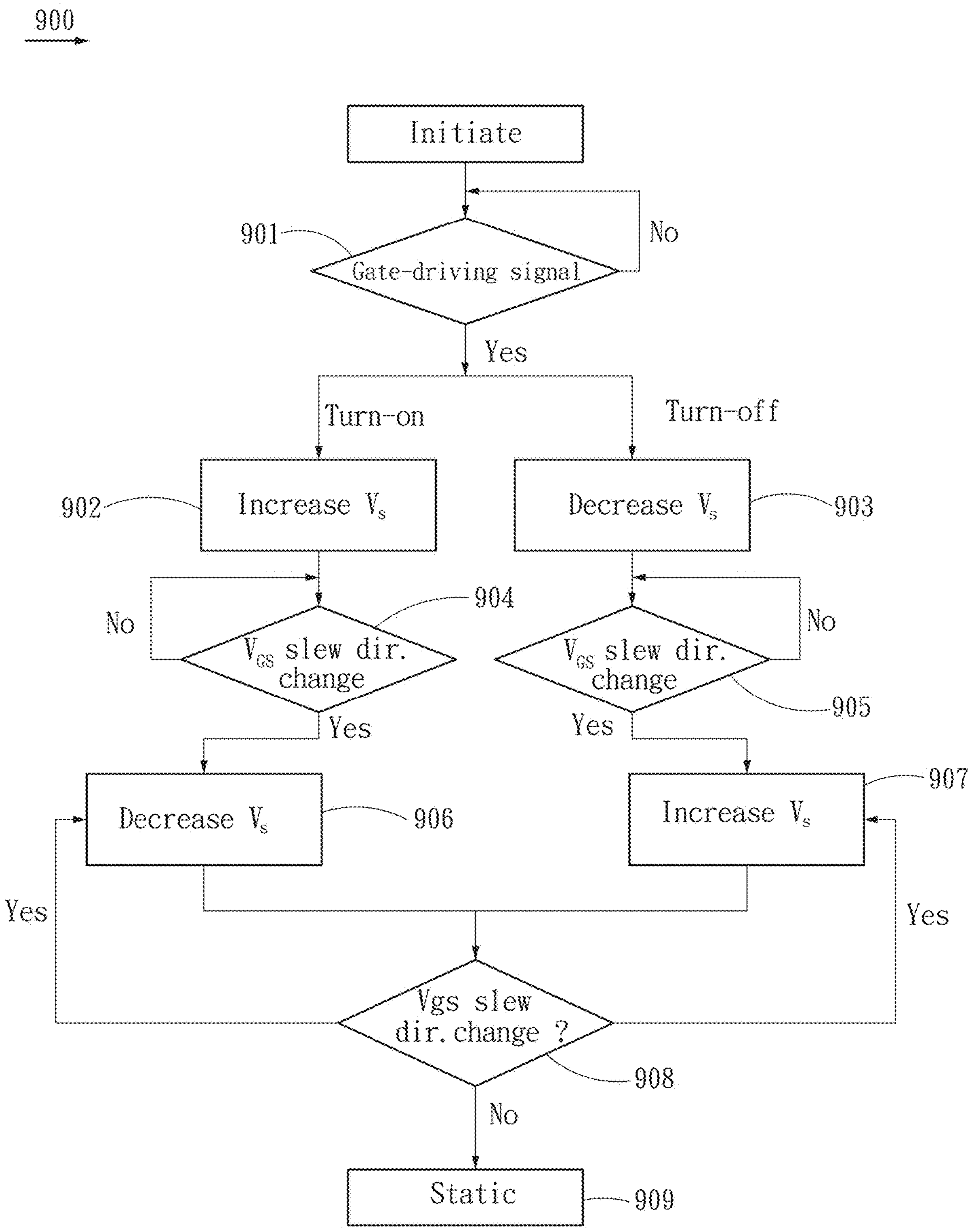
FIG. 3 illustrates one embodiment of a method of operation of the exemplary circuit topology.

The present disclosure describes a method to improve a switching speed of the switch device as the crosstalk appears on the gate-source voltage. FIG. 3 illustrates one embodiment of a method of operation 900 of the driving circuit. In operation, the gate driver control circuit 10 receives the upper-arm control signal 10*a* and the lower-arm control signal 10*b* alternately or according to a timing diagram. The gate driver control circuit 10 outputs a high side gate-driving signals 10*c* and a low side gate-driving signals 10*d* to turn on or turn off the high side switch 21 and/or the low side switch 31 (block 901), which may be a driving current to the gate of the high side switch 21 and/or the low side switch 31. During the process for turning on the high side switch 21 (or the low side switch 31), the current required to charge the gate of the high side switch 21 is supplied to the gate, thereby raising the gate-source voltage $V_{gs}$. As mentioned previously, phenomena of overshoot voltage and ringing are introduced at the beginning of turn-on. To enhance switch speed of the high side switch 21, the source voltage of the high side switch 21 is controlled to be either increased (block 902) or decreased (block 903) following with the high side gate-driving signal 10*c*, as indicated as 81 in the waveform 80 in FIG. 2, which is the example of increasing the source voltage.

If the high side gate-driving signal 10*c* is to turn on the high side switch 21, the source voltage is controlled to increase, causing the gate-source voltage $V_{gs}$ to rise above the threshold set by the gate driver control circuit 10. Once it exceeds the threshold, the gate driver control circuit 10 adjusts the gate-source voltage $V_{gs}$ of the high-side switch 21 to decrease. In other words, the purpose of increasing the source voltage is to overdrive the high-side switch 21, allowing it to exceed the threshold more quickly and thereby improving switching efficiency.

Conversely, if the high-side gate-driving signal 10*c* is intended to turn off the high-side switch 21, the source voltage is controlled to decrease, causing the gate-source voltage $V_{gs}$ to drop below the threshold set by the gate driver control circuit 10. Once below the threshold, the gate driver control circuit 10 adjusts the gate-source voltage $V_{gs}$ of the high-side switch 21 to increase. In other words, decreasing the source voltage is intended to overdrive the high-side switch 21, allowing it to drop below the threshold more quickly. The threshold described herein may refer to a protection mechanism provided by the gate driver control circuit 10 or its system. The gate driver control circuit 10 or the system may actively and instantly adjust the gate-source voltage $V_{gs}$ of the switch, either increasing or decreasing it, once the threshold is triggered.

Following the overdrive, the source voltage is adjusted depending on a variation of the gate-source voltage $V_{gs}$. If the variation of the gate-source voltage $V_{gs}$ satisfies a criterion, then an adjustment of the source voltage is made. In an example, the criterion could involve monitoring the direction of the slew in the gate-source voltage $V_{gs}$ (blocks 904, 905), that is, at the inflection points 72, 73 in the V-T waveform 70 depicted in FIG. 2. In one implementation, the criterion may be any specific variation of the slew direction of the gate-source voltage $V_{gs}$. Namely, either changes from positive slew rate to negative slew rate (inflection point 72) or from negative slew rate to positive slew rate (inflection point 73) satisfies the criterion. Once the criterion is satisfied, the source voltage is adjusted accordingly, either decreasing or increasing it (blocks 906 and 907). This adjustment is represented by points 82 and 83 in waveform 80 depicted in FIG. 2. Then, the detection of the change of the gate-source voltage Vgs and the adjustment of the source voltage are repeatedly performed (block 908) until a static of the gate-source voltage $V_{gs}$ is reached (block 909).

In the example, the source voltage may be designed to have three levels, including a first level $V_{s1}$, a second level $V_{s2}$, and a third level $V_{s3}$, as shown in FIG. 2. The first level $V_{s1}$ is higher than either the second level $V_{s2}$ or the third level $V_{s3}$ and the second level $V_{s2}$ is higher than the third level $V_{s3}$.

What is claimed is:

1. A method for controlling a switching device, comprising the following steps:

providing a power semiconductor device which is controlled by a driver, wherein a gate-source voltage and a source voltage are provided to the power semiconductor device;

outputting a gate-driving signal by the driver to a gate of the power semiconductor device, wherein when the gate-source voltage starts to increases due to first switching of the gate-driving signal, increasing the source voltage such that the gate-source voltage exceeds a positive predetermined threshold set by the driver, and when the gate-source voltage starts to decreases due to second switching of the gate-driving signal, decreasing the source voltage such that the gate-source voltage exceeds a negative predetermined threshold set by the driver, wherein the gate-driving signal is increased and decreased by the first switching and the second switching, respectively; and the source voltage is further adjusted after the gate-source voltage exceeds the positive predetermined threshold or the negative predetermined threshold, when a variation of the gate-source voltage satisfies a criterion.

2. The method of claim 1, wherein the gate-driving signal includes an upper bridge trigger signal and a lower bridge trigger signal alternately output to the gate of the power semiconductor device.

3. The method of claim 1, wherein the source voltage is configured to have at least a high level, a low level and an intermediate level, wherein the source voltage is increased by adjusting from the low level to the intermediate level or from the intermediate level to the high level, and the source voltage is decreased by adjusting from the intermediate level to the low level or from the high level to the intermediate level.

4. The method of claim 1, wherein when a slew direction of the gate-source voltage is changed, the source voltage is adjusted.

5. The method of claim 1, wherein when a slew direction of the gate-source voltage is changed from positive to negative, the source voltage is decreased.

6. The method of claim 1, wherein when a slew direction of the gate-source voltage is changed from negative to positive, the source voltage is increased.

7. The method of claim 1, wherein the power semiconductor device comprises one of a MOSFET, IGBT, FET and GaN type transistor.

8. A switching device, which is controlled by a driver, a gate-source voltage and a source voltage are provided to a power semiconductor device of the switching device and a gate-driving signal is outputted to a gate of the power semiconductor device, wherein the source voltage increases with an increase of the gate-source voltage, or the source voltage decreases with a decrease of the gate-source voltage, such that the gate-source voltage exceeds a positive or negative predetermined threshold set by the driver, wherein the increase of the gate-source voltage or the decrease of the gate-source voltage is triggered by first switching and second switching of the gate-driving signal, respectively, and the gate-driving signal is increased and decreased by the first switching and the second switching, respectively, and wherein when a slew direction of the gate-source voltage is changed from positive to negative, the source voltage starts to be decreased, and when the slew direction of the gate-source voltage is changed from negative to positive, the source voltage starts to be increased.

9. The switching device of claim 8, wherein the power semiconductor device comprises one of a MOSFET, IGBT, FET and GaN type transistor.

* * * * *